United States Patent
Brunschwiler et al.

(10) Patent No.: US 9,406,563 B2
(45) Date of Patent: Aug. 2, 2016

(54) INTEGRATED DEVICE WITH DEFINED HEAT FLOW

(71) Applicant: International Business Machines Corporation, Armonk, NY (US)

(72) Inventors: Thomas Brunschwiler, Thalwil (CH); Jens Hofrichter, Thalwil (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 16 days.

(21) Appl. No.: 14/501,445

(22) Filed: Sep. 30, 2014

(65) Prior Publication Data

US 2015/0104922 A1 Apr. 16, 2015

Related U.S. Application Data

(62) Division of application No. 13/352,151, filed on Jan. 17, 2012, now Pat. No. 8,878,071.

(30) Foreign Application Priority Data

Jan. 20, 2011 (EP) .................................. 11151543

(51) Int. Cl.
| | |
|---|---|
| *H05K 3/40* | (2006.01) |
| *H01L 21/768* | (2006.01) |
| *H01L 23/34* | (2006.01) |
| *H01L 25/065* | (2006.01) |

(Continued)

(52) U.S. Cl.
CPC ........ *H01L 21/76898* (2013.01); *H01L 21/762* (2013.01); *H01L 23/34* (2013.01); *H01L 25/0657* (2013.01); *H05K 1/0201* (2013.01); *H01L 2225/06513* (2013.01); *H01L 2225/06541* (2013.01); *H01L 2225/06589* (2013.01); *H01L 2924/0002* (2013.01)

(58) Field of Classification Search
CPC .. H05K 3/4053; H05K 3/4061; H05K 3/4069
See application file for complete search history.

(56) References Cited

U.S. PATENT DOCUMENTS

| | | | |
|---|---|---|---|
| 5,895,233 | A | 4/1999 | Higashi |
| 6,316,347 | B1 | 11/2001 | Chang |

(Continued)

FOREIGN PATENT DOCUMENTS

| | | |
|---|---|---|
| CN | 101075610 | 11/2007 |
| CN | 101123828 A | 2/2008 |

(Continued)

OTHER PUBLICATIONS

Wang, Xuan-Qi, A Fully Integrated Shear Stress Sensor, Dept. of Electrical Engineering, MS 136-93, Caltech, Pasadena, California, USA (1999).

(Continued)

*Primary Examiner* — Jeremy C Norris
(74) *Attorney, Agent, or Firm* — Jennifer R. Davis; Otterstedt, Ellenbogen & Kammer, LLP

(57) ABSTRACT

An integrated device includes at least one heat generating component which generates heat when operated, at least one temperature-sensitive component, and one or more hollow insulation regions arranged between the at least one heat generating component and the at least one temperature-sensitive component. The hollow insulation region may be provided as a vacuum gap.

10 Claims, 2 Drawing Sheets

(51) Int. Cl.
*H05K 1/02* (2006.01)
*H01L 21/762* (2006.01)

(56) References Cited

U.S. PATENT DOCUMENTS

| | | | |
|---|---|---|---|
| 6,936,491 | B2 | 8/2005 | Partridge |
| 7,397,830 | B2 | 7/2008 | Ishibashi |
| 8,309,858 | B2 * | 11/2012 | Kojima et al. ............... 174/260 |
| 2003/0159404 | A1 | 8/2003 | Chang |
| 2004/0021184 | A1 | 2/2004 | Benzel |
| 2006/0087820 | A1 | 4/2006 | Yang |
| 2007/0176298 | A1 | 8/2007 | Osone |
| 2009/0033360 | A1 | 2/2009 | Chen et al. |
| 2010/0187502 | A1 | 7/2010 | Gambino et al. |
| 2010/0290183 | A1 | 11/2010 | Rijken et al. |

FOREIGN PATENT DOCUMENTS

| | | |
|---|---|---|
| CN | 101359649 A | 2/2009 |
| CN | 101933410 | 12/2010 |
| EP | 1829819 | 5/2007 |
| JP | 2005-211247 A | 8/1993 |
| JP | 2005-101366 A | 4/2005 |
| JP | 2008172176 | 7/2008 |
| JP | 2009246258 | 10/2009 |
| JP | 2011009522 | 1/2011 |

OTHER PUBLICATIONS

Leclerc, Stephane, Novel simple and complementary metal-oxide-semiconductor-compatible membrane release design and process for thermal sensors (Abstract), Journal of Vacuum Science and Technology, vol. 16, Issue 2, 1998.

Premachandran, C.S., Design, Fabrication and Testing of Wafer Level Vacuum Package for MEMS Device, 2006 Electronic Components and Technology Conference, 1136-1140.

Jha, Chandra M., In-Chip Device-Layer Thermal Isolation of MEMS Resonator for Lower Power Budget, Proceedings of IMECE 2006, pp. 1-7.

Khanna, Ravi, Deep Reactive Ion Etching and Wafer-Level Bonding, Sensors Magazine, Apr. 2001.

Xu, Yong, Underwater Shear-Stress Sensor, IEEE 2002, 340-343.

* cited by examiner

INTEGRATED DEVICE WITH DEFINED HEAT FLOW

CROSS-REFERENCE TO RELATED APPLICATION(S)

This patent application is a divisional of U.S. patent application Ser. No. 13/352,151 filed Jan. 17, 2012, entitled "Integrated device with defined heat flow," which in turn claims foreign priority to European Patent application 11151543.3 filed 20 Jan. 2011. The complete disclosures of the aforementioned U.S. patent application Ser. No. 13/352,151 and European Patent application 11151543.3 are expressly incorporated herein by reference in their entireties for all purposes.

BACKGROUND

The present invention relates to integrated devices, in particular to integrated devices having structures for insulating temperature-sensitive components and heat-dissipating components.

Integrated systems including multiple electronic and/or non-electronic sub-systems or components (e.g. photonic components) are known in the art. Heat dissipation is a design issue in these systems and affects the placement of the components in the design phase of the integrated system. In general, measures are taken to provide efficient heat paths and heat sinks for the components, which generate heat when operated. The heat sinks are set and located to dissipate heat efficiently so that other components in the integrated system are protected from experiencing an excessive heat flow and temperature fluctuations. At the very least, heat flow through them is reduced and temperature variations are minimized to an acceptable level.

Other components in such integrated systems may be extremely temperature-sensitive, such as analog electronic components, e.g. integrated amplifiers, or photonic components, e.g. semiconductor lasers, optical resonators and the like. The performance of such a component may depend significantly on its absolute temperature, its relative temperature compared to other components and its temperature stability.

During the design phase, placing a heat-generating component next or close to such a temperature-sensitive component was generally avoided to keep the impact of the heat generation on the temperature-sensitive parts as low as possible. Thermally decoupling of those components in an integrated system was generally performed by keeping the components apart from one another by placing them in different locations in integrated systems.

To meet the temperature specifications of the individual components in a 3D chip stack is challenging due to the high thermal cross-talk between the components. In an arrangement where a heat flow path for heat generated in one component passes through another component to a heat sink, the temperature of the one component is essentially affected by the activity of the component between the one component and the heat sink, resulting in a high absolute temperature and large temperature modulation.

However, in some cases a heat-dissipating component and a temperature-sensitive component need to be placed next to one another e.g. due to signal communication issues either in lateral or vertical arrangements with respect to the main plane of the integrated device. In these cases heat flow is difficult to control.

Existing solutions use e.g. more than one heat sink element on the integrated system or increase their heat dissipation capacity. However, despite those measures for providing heat dissipation, heat coupling between components placed close or next to one another is not negligible. The placement of the components for an integrated system is still dominated by thermal considerations.

BRIEF SUMMARY

According to an embodiment of a first aspect, an integrated device is provided comprising: at least one heat generating component which generates heat when operated, at least one temperature-sensitive component, and one or more hollow insulation regions arranged between the at least one heat generating component and the at least one temperature-sensitive component.

According to embodiments of the invention, a thermal decoupling between two integrated components within an integrated device is provided by providing a hollow insulation region between at least one heat generating component and at least one temperature-sensitive component. The hollow region may provide strong heat insulation since conductive and, if provided with a vacuum or at least a low-pressured gas, convective heat coupling, which represents the dominating heat flow mechanism at operating temperatures of common integrated devices of below 130° C., is efficiently suppressed. To place insulation regions within the integrated device allows controlling heat flow within the integrated device. By partly encompassing a heat-generating component, the heat flow can be channeled and directed to heat sink elements.

According to an embodiment of the invention, the hollow insulation region is provided as a vacuum gap or a vacuum chamber including a vacuum or a low-pressured gas.

Further, the integrated device may have a main plane, wherein the one or more hollow insulation regions may include at least one of a lateral insulation region extending substantially in parallel to the main plane and a vertical insulation region extending substantially perpendicularly to the main plane.

It can be provided that one or more vertical insulation regions and one or more lateral insulation regions are combined to form a heat flow channel from the at least one heat generating component and/or the at least one temperature-sensitive component.

According to an embodiment the integrated device may comprise multiple stacked substrate layers, wherein the one or more vertical insulation regions are formed by means of unfilled through-vias through one or more of the substrate layers and/or wherein the one or more lateral insulation regions are formed in a metallization and/or wiring layer.

Furthermore, the one or more lateral insulation regions may be formed by means of a membrane spaced from a surface of a base substrate of the substrate layer.

The insulation regions may encompass the at least one heat generating component and/or the at least one temperature-sensitive component on two to five sides, respectively, wherein no insulation region is provided on a side which is directed to one of the main planes.

On at least one of the main planes a heat removing element may be attached to dissipate heat guided to the at least one main plane.

According to a further embodiment, the at least one heat generating component comprises at least one of an electronic/electric circuit comprising one or more of an electronic amplifier, an output driver and a heater, and wherein the at least one temperature-sensitive component comprises at least one of an photonic element comprising one or more of a laser element, an optical modulator or multiplexer, an optical filter, an optical grating, and optical cavity, an electronic circuit, and an optoelectronic sensing circuit.

Furthermore, on opposing sides of the insulation region a waveguide and a laser element may be arranged such that laser light emitted from the laser element is coupled through the insulation region into the waveguide and vice versa, in particular by evanescent coupling.

Furthermore, the insulation region may provide an electrical signal communication channel which passes through the insulation region such as to provide a mechanical support for the hollow insulation region.

According to an embodiment of a further aspect of the invention, a method for fabricating an integrated device is provided. The method comprises the steps of providing a substrate having one or more components, forming a number of through-vias through a substrate layer, applying a low-pressure atmosphere or a vacuum environment on the substrate layer, hermetically closing at least one of the through-vias to obtain an insulation region, and providing conductive material to the substrate to fill the not hermetically closed through-vias to form through-via interconnects.

According to an embodiment of a further aspect of the invention, a method for fabricating an integrated device is provided. The method comprises the steps of providing a base substrate having one or more components, forming a wiring and metallization layer on one surface of the base substrate, wherein a lateral insulation region is formed by etching away a sacrificial layer to form a cavity and by hermetically closing the cavity while a low-pressure atmosphere or a vacuum environment is applied.

BRIEF DESCRIPTION OF THE DRAWINGS

Embodiments of the present invention are described in detail in conjunction with the accompanying drawings in which.

DETAILED DESCRIPTION

Figure 1:
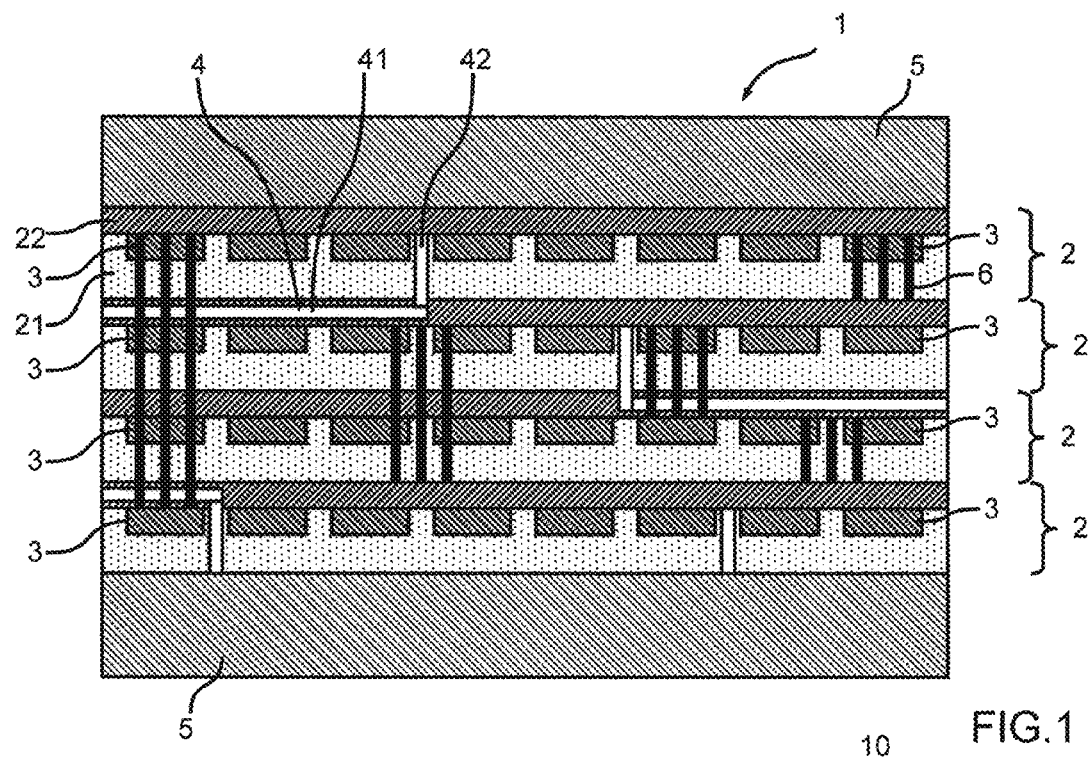
FIG. 1 shows a schematic cross-sectional view of an integrated device stack having compartments defined by vertical and lateral vacuum gaps in conjunction with two heat sinks.

FIG. 1 schematically shows the principle of providing a heat flow control in an integrated device 1. The integrated device 1 of FIG. 1 shows a multilayered device, wherein each layer comprises a substrate 2 including one or more components 3. The substrate 2 can be a semiconductor substrate, such as e.g. a silicon substrate and the like or a silicon-on-insulator-substrate (SOI-substrate). The components 3 can include electronic and/or non-electronic active or passive elements such as photonic and/or micromechanical elements. Examples for electronic components are amplifiers, active or passive filters, logic components and the like. Electronic components can be formed in CMOS, Bipolar or BiCMOS technology. Examples for non-electronic components are laser elements, photodiodes, optical resonators, optical filters, optical gratings, optical cavities, mechanical resonators, micromechanical sensors and the like. In general, components can be single electronic or non-electronic elements or circuits and sub-systems including a combination of electronic and/or non-electronic elements.

The integrated device 1 of FIG. 1 is comprised of four substrate layers 2 which are stacked so that the main planes of neighboring substrates are fixedly attached to one another. The substrate stack is sandwiched between two heat removal elements 5 in order to allow a heat flow from the stacked substrate layers 2 onto both outer main planes of the substrate layer stack. The number of substrate layers is not limited to four. The integrated device can have any number of substrate layers including just one substrate layer.

Due to electrical power consumption, each active component 3 comprises a specific heat generation rate when operated and therefore acts as heat generating component. Some of the active and passive components provide a temperature sensitivity, wherein the performance of the components 3 is strongly affected by its temperature. In particular, if components 3 having a high heat dissipation rate are located in the vicinity of or adjacent to components 3 having a high temperature sensitivity, either laterally or vertically, the overall performance of the temperature-sensitive components 3 might be degraded.

To thermally decouple two or more components 3 from each other heat insulating regions are integrated in the integrated device 1. The heat insulating regions are provided as hollow insulation regions which are formed as hollow gaps such as vacuum gaps 4 or vacuum chambers, which substantially provide two distanced opposing surfaces having no physical contact with each other. The vacuum gap 4 is hermetically closed and holds a vacuum or a low pressured gas. Thereby, a conductive or convective heat coupling between areas of the integrated device associated with the distanced opposing surfaces is eliminated. The distance between the opposing surfaces of the vacuum gap 4 is between 50 nm and 50 µm, preferably between 50 nm and 500 nm, more preferably between 100 nm and 300 nm.

By arranging the vacuum gaps 4, a main heat flow direction for one or more components 3 can be directed to the one or the other heat removal element 5, thereby protecting temperature-sensitive components 3 from any heat flow generated by any neighboring high power consuming components. As a matter of design strategy, either one of the heat-generating components and the temperature-sensitive components, or both, can be surrounded by vacuum gaps 4 to insulate them from adjacent components.

The vacuum gap 4 is adapted to include a vacuum. Technically, this means that the cavity of the vacuum gap 4 contains a low-pressured gas such as air, an inert gas, a noble gas or the like. The low pressured gas atmosphere has pressures to efficiently suppress convection e.g. pressures lower than 300 hPa, preferably lower than 100 hPa. It turned out that pressures below 100 hPa already provide a very high thermal insulation.

The substrate layers 2 include a base substrate 21 comprising the active and/or passive components 3 and an BEOL layer 22, which can be provided with layers for metallization (wiring) and insulation which are fabricated in a BEOL (Back-end of line) process. Vacuum gaps 4 can be provided as laterally extending vacuum gaps 41 (lateral vacuum gaps), which extend in parallel to the main planes of the respective substrate layers 2 or as vertically extending vacuum gaps 42 (vertical vacuum gaps) which extend perpendicularly to the main planes of the respective substrate layers 2.

For interconnecting the components 3 of different substrate layers 2, through-via interconnects 6 can be arranged in order to provide an electronic interconnection between the components 3 of different substrate layers 2. The through-via interconnects 6 can be arranged to pass through lateral vacuum gaps 41 in order to electrically interconnect components 3 which are thermally decoupled from one another by the lateral vacuum gap 41. Low thermal conductive through-via interconnects are preferred such as through-via interconnects 6 made of tungsten.

Figure 2:
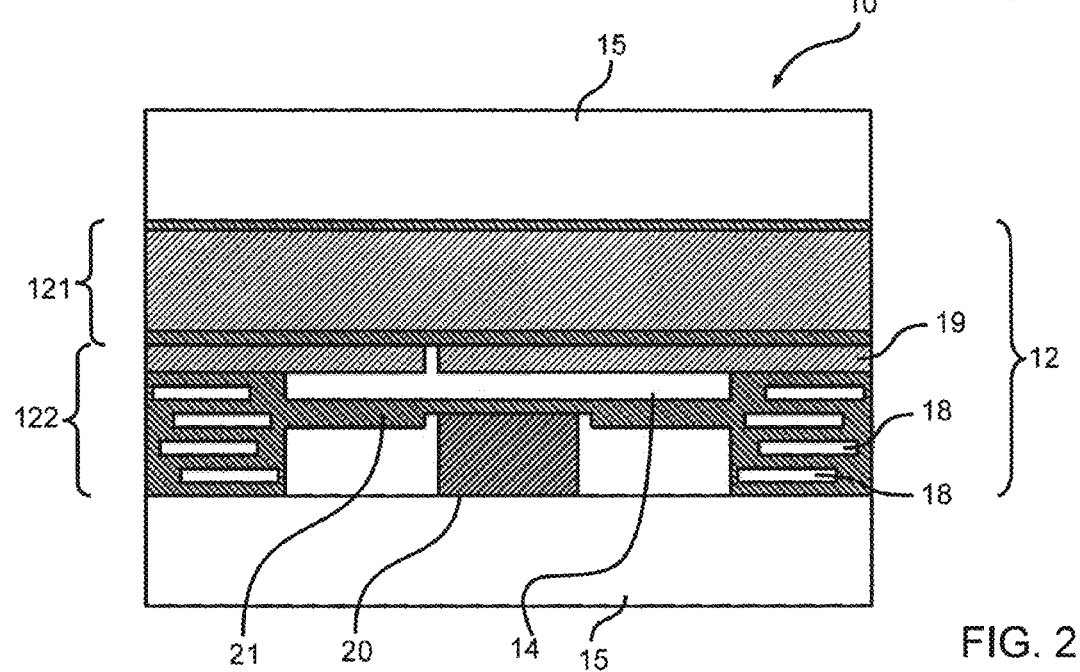
FIG. 2 shows an integrated device having on one layer electronic components with optical waveguides and a laser component on a second layer thermally decoupled from one another by a vacuum gap.

According to a more specific embodiment, a portion of another integrated device 10 is shown in FIG. 2. The integrated device 10 of FIG. 2 has a single substrate layer 12 which is provided as a silicon-on-insulator-substrate. In the substrate layer 12, electronic elements and components (not shown) are comprised in a base substrate 121. The base substrate 121 is formed by a semiconductor layer, which is deposited on a silicon base substrate having a silicon dioxide insulation layer (silicon-on-insulator). As well known in the art, the semiconductor layer has electronic circuits with electronic elements which may be fabricated using integrated semiconductor technology. The substrate layer 12 further comprises an active layer included in the semiconductor layer (base substrate 121) having electronic circuits. The electronic circuits dissipate heat when operated and therefore act as heat generating components.

In a BEOL layer 122 of the substrate layer 12, one or more metallization and wiring metal layers 18 are included to laterally wire the electronic components 3 and/or to provide electrical contacts. The BEOL layer 122 is deposited on the base substrate 121 in subsequent processes for depositing and patterning layers as known in the art.

One of the metal layers 18 of the BEOL layer 122 can also comprise an optical waveguide 19. In silicon technology the waveguide can be e.g. formed of silicon dioxide. Additionally or alternatively, the waveguide 19 can be provided as a buried silicon dioxide structure in the base substrate 121.

The substrate layer 12 may be sandwiched between two heat removal elements 15, which contact the outer main planes of the substrate layer 12 to dissipate heat generated therein. A first heat removal element 15 is associated to a surface of the base substrate opposing the BEOL layer 122. A second heat removal element 15 is associated to a surface of the BEOL layer 122 opposing the base substrate 121.

The BEOL layer 122 may further comprise an optical component 3 such as a semiconductor laser element 20 as an example for a temperature-sensitive element. The laser element 20 is arranged on a membrane 21 formed in the BEOL layer 122. The membrane 21 defines a vacuum gap 14 which is arranged between the membrane 21 and the base substrate 121. The laser element 20 is aligned, such that light emitted by the laser element 20 is coupled through the vacuum gap into the waveguide 19.

The vacuum gap 14, defined by the membrane 21 and the inner surface of the base substrate 121, thermally decouples the laser element 20 from the electronic elements embedded in the base substrate 121. The laser element 20 is arranged such that light emitted by the laser element 20 is coupled through the vacuum gap 14 into the waveguide of the first substrate layer. The coupling may be performed as an evanescent coupling as long as the thickness of the vacuum gap 4 is between 10 nm to 10 μm.

Heat removal elements 15 are attached on both sides of the substrate layer 2 such that due to the vacuum gap 14 the heat removal element 15 associated with the base substrate 121 dissipates heat generated by the base substrate 121 and the heat removal element 15 associated with the BEOL layer 122 dissipates heat generated by the laser element 20.

The heat removal element 15 associated with the respective layer 121, 122 can correspond to a standard cold plate which can be directly coupled to the substrate layer 12. Alternatively, the heat removal element 15 can include a silicon interposer which may provide fluid channels for a cooling medium for dissipating heat generated by the components 3 embedded in the substrate layer 2. Furthermore, the silicon interposer can comprise electrical through-vias to provide a signal and/or power transmission to the BEOL layer 122 or the base substrate 121.

The laser element 20 can be arranged on the membrane 21 formed in the BEOL layer 122 such that the laser element 20 is laterally insulated from the material of the second substrate layer. The membrane 21 can be comprised of an optical transparent material such as silicon dioxide and such, used as dielectrics in the BEOL layers, through which the laser light is emitted through the vacuum gap 4 onto the waveguide 19 that is disposed in the BEOL layer 122 on the surface of the base substrate 121.

The general process for manufacturing a device as shown in FIG. 2 is described in the following. After embedding the components in the substrate layer 12 which may be a silicon-on-insulator substrate having a silicon-based substrate on which an insulator layer, such as silicon dioxide, is disposed, a waveguide structure is formed on the surface of the base substrate 121. The vacuum gap 14 is fabricated onto the waveguide structure or at least onto an interface portion of the waveguide, wherein the vacuum gap 14 is closed by a membrane such that the vacuum gap 14 is formed with a thickness of about 50 to 500 nm. After forming the vacuum gap 14, the BEOL layer 122 including metallization and wiring patterns is formed on the surface of the base substrate 121. The BEOL layer 122 is patterned to provide the membrane 21. If necessary, the membrane 21 is etched to provide a recess in the BEOL layer 122 to accommodate the laser element 20. The laser element 20 is bonded to the membrane 21 such that the laser element 20 and the further BEOL layer 122 are laterally spaced and interconnecting solder bonds are formed to provide a contact between the laser element 20 and contact pads of the upper wiring layer. Alternatively, the membrane 21 may also comprise active material. To form a laser element 20, the membrane 21 is bonded onto the substrate layer 12 and subsequently structured.

In a further embodiment, the membrane 21 can be formed before forming the metallization and wiring patterns and the laser element 20 can be bonded to the membrane 21 before the deposition of the metallization and wiring layers on the active surface of the base substrate 121 to form the BEOL layer 122.

Figure 3:
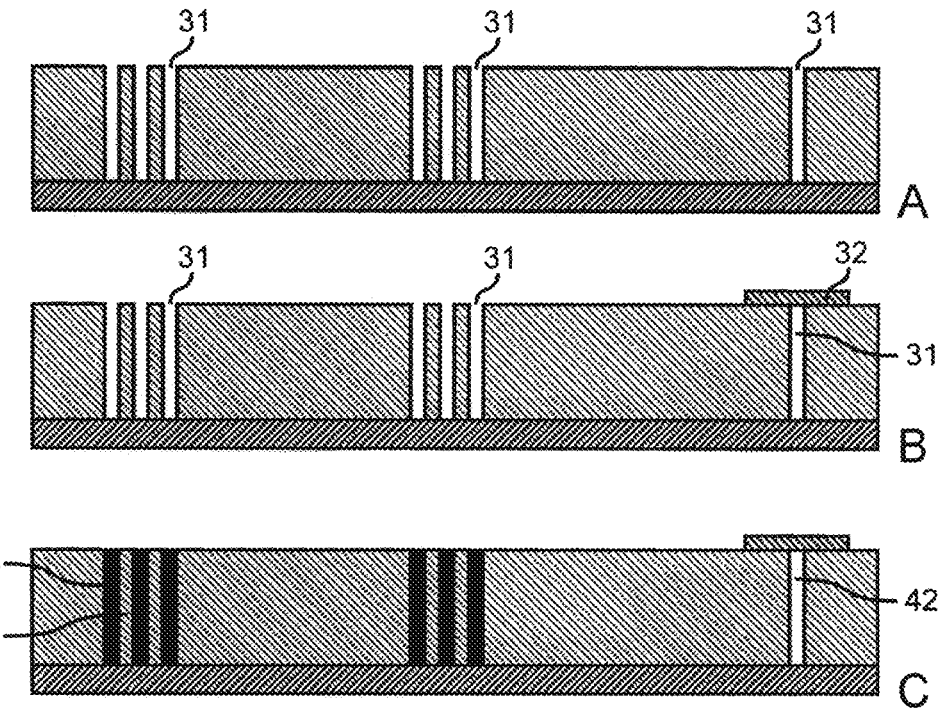
FIGS. 3A to 3C show a schematic illustration of the steps for manufacturing vertical vacuum gaps and through-silicon vias in a combined process.

According to the process states as shown in FIGS. 3A to 3C, in an integrated device 1 having multiple substrate layers 2 the process for forming through-via interconnects 6 can be used to also form vertical vacuum gaps 4. According to a first state, which is shown in FIG. 3A, through-vias 31 are formed through the substrate 2 e.g. by a deep reactive-ion etching (DRIE) process which is a highly anisotropic etch process used to create deep, steep-sided holes and trenches in substrates. The plurality of through-vias 31 formed comprise the ones which shall be further processed to form electrical through-via interconnects 6 and the ones, which shall be made to vertical vacuum gaps 42.

Thereafter, the through-via 31, which shall be made to vertical vacuum gaps 42 are provided with a cap 32 (process state of FIG. 3B) to cover the opening on one surface before filling the not covered through-vias 31 with a conductive material 33 in a following deposition process. The state shown in FIG. 3c shows the substrate layer 2 provided with through-via interconnects 6 and vertical vacuum gaps 42. The vacuum in the vertical vacuum gap 42 can be achieved by placing the cap 32 in a low-pressure atmosphere/vacuum environment such that the vertical vacuum gap 42 is hermetically closed against the environment and the vacuum is maintained in the interior of vacuum gap 42.

Figure 4:
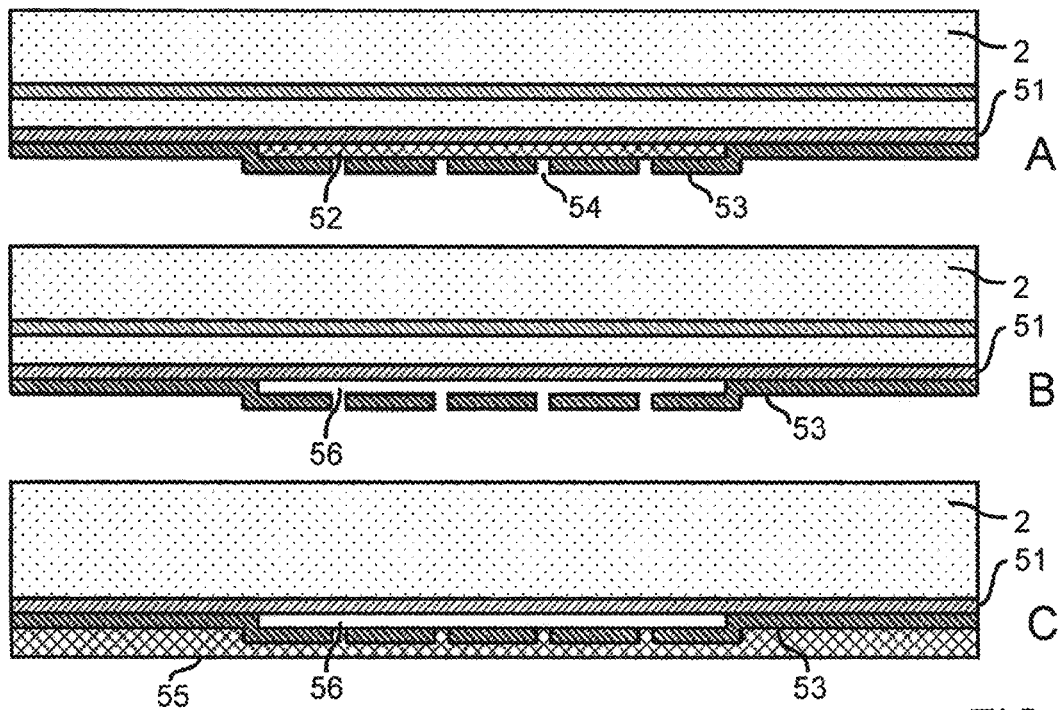
FIGS. 4A to 4C show a schematic illustration of the steps for manufacturing lateral vacuum gaps.

FIGS. 4A to 4C show exemplary process states for manufacturing the lateral vacuum gap 41 on a surface of a substrate layer 2. In the area where the lateral vacuum gap 41 is to be formed, a first layer 51 of silicon dioxide is deposited. Subsequently, a poly-silicon layer 52 is deposited and patterned as a sacrificial layer so that the poly-silicon layer 52 is only present in the area where the lateral vacuum gap 41 is to be formed. Onto the poly-silicon layer 52 a second layer 53 of silicon dioxide is deposited and patterned to form access holes 54 for a subsequent etching process. This state is shown in FIG. 4A. Through the access holes 54 the poly-silicon layer 52 is etched until it is completely resolved. Thereby, a cavity 56 is formed.

The arrangement is brought into a vacuum environment such that the cavity is evacuated as shown in FIG. 4B. As shown in FIG. 4C, a closing silicon dioxide layer 55 is deposited for closing the access holes 54 and capturing the vacuum in the cavity 56 formed before by the sacrificial poly-silicon layer 52. For larger areas of lateral vacuum gaps 41, supporting elements can be formed within the cavity 56 by providing recesses or through-holes in the poly-silicon layer 52 when the poly-silicon layer 52 is patterned. Additionally, electrical through-vias can be implemented into the vacuum gap, acting as supporting element and allowing electrical signal transmission. The above processing is exemplary and other processes can be involved or included without changing the basic idea of fabricating a vacuum gap.

REFERENCE LIST

1 integrated device
2 substrate layer
3 component
4 vacuum gap
5 heat removal element
6 through-via interconnect
10 integrated device
12 substrate layer
14 vacuum gap
15 heat removing element
18 metal layers
19 waveguide
20 laser element
21 membrane
22 BEOL layer
31 through-via
32 cap
33 electrical conductive material
41 lateral vacuum gap
42 vertical vacuum gap
51 first silicon dioxide layer
52 poly-silicon layer
53 second silicon dioxide layer
54 holes
55 closing silicon dioxide layer
56 cavity
121 base substrate
122 BEOL layer

What is claimed is:

1. A method for fabricating an integrated device, comprising the steps of:
providing a heat removing element;
providing a substrate layer on the heat removing element, the substrate layer having one or more components, including a heat generating component;
forming a plurality of through-vias extending entirely through the substrate layer; and
forming, while applying a low-pressure atmosphere or a vacuum environment on the substrate layer, a hollow insulation region, by hermetically closing at least one of the through-vias,
wherein the hollow insulation region is a first vacuum gap, and
wherein the hollow insulation region partly encompasses the heat generating component and defines a heat flow channel in the substrate layer for channeling heat from the heat generating component to the heat removing element.

2. A method for fabricating an integrated device, comprising the steps of:
providing a base substrate having one or more components, including a heat generating component;
forming a first wiring and metallization layer on a first surface of the base substrate;
etching the first wiring and metallization layer to form a cavity therein; and
forming, while applying a low-pressure atmosphere or a vacuum environment on the first wiring and metallization, a lateral hollow insulation region, by hermetically closing the cavity, wherein the lateral hollow insulation region is a first vacuum gap,
wherein the lateral hollow insulation region partly encompasses the heat generating component and defines a heat flow channel in the base substrate for channeling heat from the heat generating component.

3. The method of claim 2, further comprising:
forming, before forming the first wiring and metallization layer, a plurality of through-vias extending entirely through the base substrate; and
forming, while applying a low-pressure atmosphere or a vacuum environment on the substrate layer, a vertical hollow insulation region, by hermetically closing at least one of the through-vias extending entirely through the base substrate,
wherein the vertical hollow insulation region is a second vacuum gap, and
wherein the vertical hollow insulation region and the lateral hollow insulation region partly encompass the heat generating component and define the heat flow channel in the base substrate for channeling heat from the heat generating component.

4. The method of claim 3, further comprising forming a through-via interconnection by providing an electrical conductive material to the base substrate to fill at least one of the through-vias, wherein the electrical conductive material is electrically connected to a second wiring and metallization layer disposed on a second surface of the base substrate opposite the first surface of the base substrate.

5. The method of claim 2, further comprising forming the base substrate on a heat removing element, wherein the lateral hollow insulation region partly encompasses the heat generating component and defines the heat flow channel in the base substrate for channeling heat from the heat generating component and to the heat removing element.

6. The method of claim 1, further comprising:
depositing a first metallization layer on the substrate layer;
etching the first metallization layer to form a cavity therein; and forming, while applying a low-pressure atmosphere or a vacuum environment on the substrate layer, a lateral hollow insulation region, by hermetically closing the cavity, wherein the lateral hollow insulation region is a second vacuum gap, wherein the hollow insulation region and the lateral hollow insulation region partly encompass the heat generating component and define the heat flow channel in the substrate layer for channeling heat from the heat generating component to the heat removing element.

7. The method of claim 6, further comprising:

depositing a second substrate layer on the first metallization layer, the second substrate layer having one or more components;

forming a through-via extending entirely through the second substrate layer;

forming a through-via interconnection by providing an electrical conductive material to the second substrate layer to fill the through-via extending entirely through the second substrate layer; and depositing a second metallization layer on the second substrate layer, wherein the through-via interconnection electrically connects the first metallization layer to the second metallization layer.

8. The method of claim 1, further comprising depositing a first metallization layer on the substrate layer prior to providing the substrate layer, wherein the first metallization layer is disposed between the heat removing element and the substrate layer.

9. The method of claim 8, further comprising:

forming a through-via interconnection by providing an electrical conductive material to the substrate layer to fill at least one of the through-vias; and depositing a second substrate layer and a second metallization layer on the substrate layer, the second substrate layer having one or more components, wherein the second metallization layer is disposed between the substrate layer and the second substrate layer and the through-via interconnection electrically connects the first metallization layer and the second metallization layer.

10. The method of claim 9, further comprising:

etching the second metallization layer to form a cavity; and forming, while applying a low-pressure atmosphere or a vacuum environment on the second substrate layer, a lateral hollow insulation region, by hermetically closing the cavity, wherein the lateral hollow insulation region is a second vacuum gap, wherein the hollow insulation region and the lateral hollow insulation region partly encompass the heat generating component and define the heat flow channel in the integrated device for channeling heat from the heat generating component to the heat removing element.

* * * * *